United States Patent [19]

Miura

[11] 4,339,726
[45] Jul. 13, 1982

[54] DEMODULATOR OF ANGLE MODULATED SIGNAL OPERABLE BY LOW POWER VOLTAGE

[75] Inventor: Masami Miura, Tokyo, Japan

[73] Assignee: Nippon Electric Co., Ltd., Tokyo, Japan

[21] Appl. No.: 181,930

[22] Filed: Aug. 27, 1980

[30] Foreign Application Priority Data

Aug. 29, 1979 [JP] Japan .................................. 54-110570
Aug. 29, 1979 [JP] Japan .................................. 54-110571

[51] Int. Cl.³ .............................................. H03D 3/22
[52] U.S. Cl. .................................... 329/103; 329/137; 329/140; 329/145; 455/214
[58] Field of Search ............... 329/103, 110, 118, 137, 329/138, 140–143, 145; 455/214, 337

[56] References Cited

U.S. PATENT DOCUMENTS 3,586,986 6/1971 Martens et al. ...................... 329/103
4,119,919 10/1978 Sugawara ........................ 329/137 X

*Primary Examiner*—Siegfried H. Grimm
*Attorney, Agent, or Firm*—Sughrue, Mion, Zinn, Macpeak & Seas

[57] ABSTRACT

A demodulator for an angle modulated signal consists of circuitry particularly adaptable to integrated circuit construction. The various circuit functional groups are adapted to be connected in parallel, rather than serially, across the power source, thereby enabling good performance in systems having low voltage power sources. The angle modulated signal is converted into first and second signals of opposite phase. Also, the angle modulated signal is phase shifted an amount dependent upon the frequency deviation from a center frequency, the first and phase shifted signals are applied to a first OR circuit which provides the largest input signal as its output. The second and phase shifted signals are applied to a second OR circuit which provides the largest input signal as its output. The two OR circuit outputs are low-pass filtered and subtracted to provide the demodulated output.

10 Claims, 11 Drawing Figures

U.S. Patent  Jul. 13, 1982  Sheet 1 of 3  4,339,726
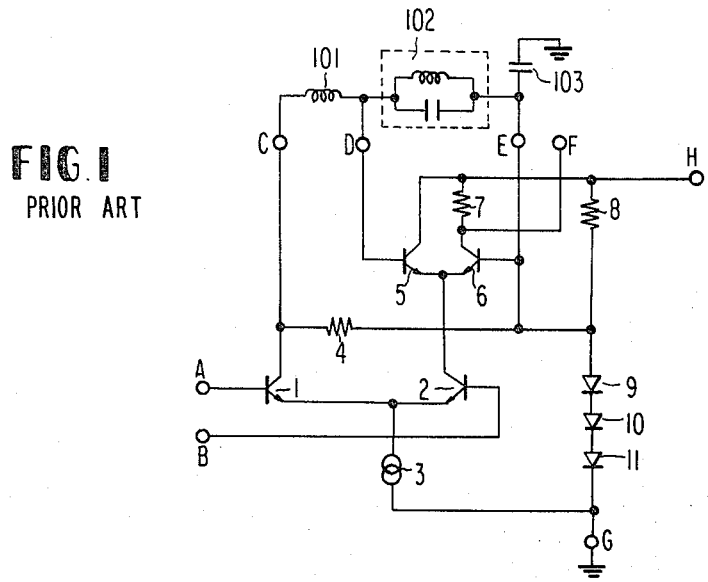
FIG. 1
PRIOR ART
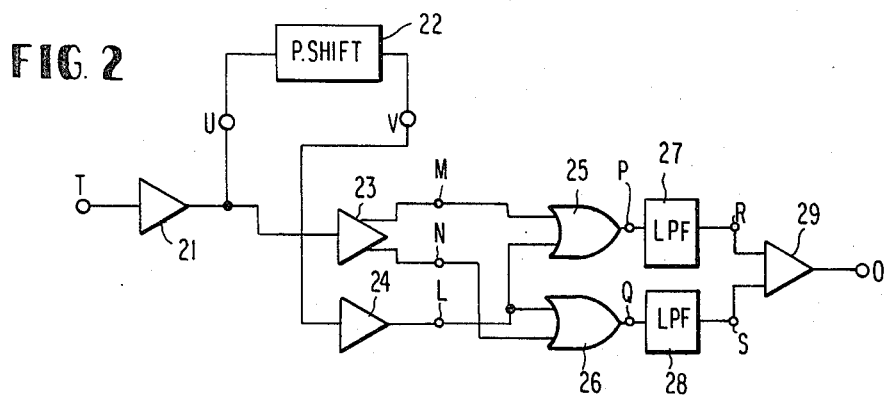
FIG. 2
FIG. 3
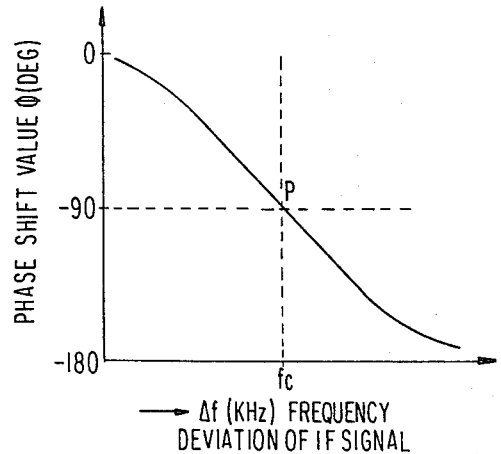
FIG. 4
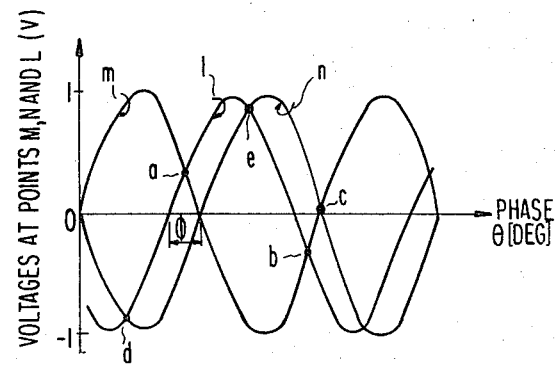

DEMODULATOR OF ANGLE MODULATED SIGNAL OPERABLE BY LOW POWER VOLTAGE

BACKGROUND OF THE INVENTION

1. Field of the Invention

The present invention relates to a demodulator for demodulating an angle modulated signal such as a frequency modulated signal and, more particularly, to a demodulator suited for use in a receiver operated by a low voltage power source.

2. Description of the Prior Art

Angle modulation is divided into frequency modulation and phase modulation. The present invention will be described in the following in the case of the frequency modulation.

As the detecting system for a frequency modulated signal (hereinafter referred to as an FM signal), there has been widely known a Foster-Seely discriminator or a ratio detector, which is, however, not suited for a semiconductor integrated circuit. Recently, a desire has arisen for an FM detecting system which can be formed in a semiconductor integrated circuit. In order to meet this desire, a quadrature detecting system has been developed and is disclosed in U.S. Pat. No. 3,667,060 granted to Jack Avins. According to that disclosure, the FM signal is applied to a first differential amplifier and is phase-shifted and applied to a second differential amplifier, which is to be supplied with its emitter current from one of the outputs of the first differential amplifier, so that a demodulated signal is generated from the output of the second differential amplifier.

Since the quadrature detecting system thus far described requires a number of transistors connected in cascade between the power supply terminals, a defect of the system is that the power supply voltage necessary for normal operation is high. More specifically, the quadrature detecting system can exhibit excellent performance, such as a distortion-free operation, when used in a home stereo system which can have a sufficient power supply voltage, such as 12 V. However, the performance of the quadrature detecting system deteriorates when it is operated at a power supply voltage as low as 2 to 6 V, i.e., by which a portable radio receiver or a portable radio receiver with a cassette tape recorder is operated.

SUMMARY OF THE INVENTION

It is therefore a major object of the present invention to provide a demodulator for demodulating an angle modulated signal which provides excellent demodulating performance even at a low power supply voltage and which is suitable for assembly into an integrated semiconductor circuit.

According to the present invention, there is provided a demodulator comprising converting means for converting an angle modulated signal into first and second signals having phases opposite to each other, a phase shift circuit for shifting the phase of a signal having information of the angle modulated signal by a value in accordance with the deviation in frequency from the center frequency of the angle modulated signal, a first OR circuit for taking the larger one of the first signal and the output of the phase shift circuit, a second OR circuit for taking the larger one of the second signal and the output of the phase shift circuit, subtracting means for subtracting the outputs of the first and second OR circuits from each other, and outputs means for deriving an output from the substracting means. The signal having information of the angle modulated signal to be shifted in phase by the phase shift circuit may be either the angle modulated signal or one of the first and second signals.

According to the present invention, the demodulator can be all constituted of simple circuit constructions, i.e. a signal converter, a phase shift circuit, OR circuits, and a subtractor, thus simplifying the circuit design. Moreover, the circuit can be constructed by inter-connecting the respective circuit constructions wired in parallel between power supply terminals so that the voltage necessary for operating the circuit can be sufficiently low. This implies that sufficient demodulating performance can be exhibited even where the demodulator is driven by a dry cell so that only a low power supply voltage can be attained. It is also implied that, in case a high power supply voltage is obtained, the applicable bias voltage is widened to increase the degree of freedom of the circuit design because the minimum operating voltage of the demodulator is low. Still moreover, all but the phase shift circuit can be easily integrated into a semiconductor integrated circuit by well-known integrated circuit techniques so that the demodulator according to the present invention is suitable for the semiconductor integrated circuit.

BRIEF DESCRIPTION OF THE DRAWINGS

The above and further objects, features and advantages of the present invention will become apparent from the following detailed description taken in conjunction with the accompanying drawings, in which:

FIG. 1 is a diagram showing a quadrature detector circuit according to the prior art;

FIG. 2 is a block diagram showing a first embodiment of the present invention;

FIGS. 3 to 8 are illustrative views explaining the operations of the present invention;

DESCRIPTION OF THE PREFERRED EMBODIMENTS

Figure 5:
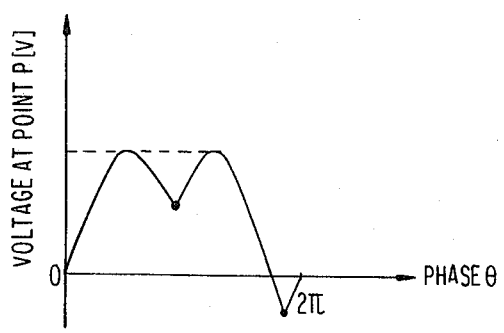

Referring first to FIG. 1, a quadrature detector circuit according to the prior art includes transistors 1 and 2, which are connected in such a differential manner as to be supplied with a current from a constant current source 3 having its one end connected with a grounded terminal G. The collector of the transistor 2 is connected with the common emitter of transistors 5 and 6 which are connected similarly in a differential manner. The transistor 5 has its collector connected directly with a power supply terminal H whereas the transistor 6 has its collector connected with the power supply terminal H through a load resistor 7. There is connected between the main terminal H and the grounded terminal G a series connection of a resistor 8 and three diodes 9, 10 and 11 for applying a bias voltage to the base of the transistor 6 directly from the connection between the resistor 8 and the diode 9 and to the collector of the transistor 1 through the resistor 4 from the same connection. From the collector of the transistor 1 and the bases of the transistors 5 and 6, there are led three terminals C, D and E, respectively, which are connected with a phase shift circuit composed of an inductor 101, a resonance circuit 102 including an inductor and a capacitor, and a capacitor 103. Input terminals A and B connected with the bases of the transistors 1 and 2, respectively, are supplied with either an FM signal or an intermediate frequency signal converted from the former. The demodulated signal is generated at an output terminal F connected with the connection between the load resistor 7 and the collector of the transistor 6.

Generally, after a received FM signal is converted into an FM intermediate frequency (FMIF) signal, the FMIF signal is amplified by an intermediate frequency amplifier (FMIF amplifier) and then applied to an FM demodulator. In case of the abovementioned quadrature detector circuit, FMIF signals having phases opposed each other are derived from the FMIF amplifier, and supplied to the bases of the transistors 1 and 2 through the input terminals A and B. An output from the collector of the transistor 1 is shifted in phase in accordance with the deviation in frequency from the FM intermediate frequency by the phase circuit. The signal having its phase shifted is fed to the base of the transistor 5 from the terminal D, while the signal having no phase shifted is fed to the common emitter of the transistors 5 and 6 from the collector of the transistor 2. The transistors 5 and 6 operate as a multiplier for multiplying both the phase-shifted and the non-phase shifted signals, so that the output of the multiplier is extracted as the FM demodulated output signal from the terminal F through the load resistor 7.

Thus, the quadrature detector circuit shown in FIG. 1 can exhibit excellent performance, in that case where it is operated at power supply voltage of about 12 V as used in a home stereo system, but cannot operate in normal condition where the voltage of a battery driving a portable radio receiver or a portable radio receiver with a cassette tape recorder is below 3 V. In other words, in order that both transistors 5 and 6 constituting the multiplier and transistors 1 and 2 constituting the differential amplifier may be normally biased, the power supply terminal H has to be supplied with a voltage of at least about 3 V. As a result, the quadrature detector circuit deteriorates its output to involve a remarkable distortion, when it is operated at a low voltage source (especially in case the voltage is at most 3 V).

Referring now to FIGS. 2 to 8, the principles of the first embodiment of the present invention will be described in the following.

In FIG. 2, a terminal T is an FM intermediate frequency signal input terminal. Terminals U and V are connecting terminals of a phase shift circuit 22. A terminal O is a demodulated output terminal. The FM intermediate frequency signal fed to the terminal T is amplified by an intermediate frequency amplifier (hereinafter, referred to as IF amplifier) 21. After that, the output signal of the IF amplifier 21 is fed directly to an amplitude limiting amplifier (hereinfter, referred to a limiter amplifier) 23 thereby to generate two outputs in phase opposition. On the other hand, the output of the IF amplifier 21 is shifted in phase by the phase shift circuit 22 and is then applied to a limiter amplifier 24. The two outputs of the limiter amplifier 23 are applied to OR circuits 25 and 26, respectively, through circuit points M and N. The output of the limiter amplifier 24 is also fed to the OR circuits 25 and 26 through a circuit point L. Here, each of the OR circuits 25 and 26 is designed to derive a higher one of the two input signals. The outputs of the OR circuits 25 and 26 are applied to low-pass filters 27 and 28 of the next stage, respectively, through circuit points P and Q. The outputs of those low-pass filters 27 and 28 are applied to the input terminals R and S of a subtractor 29, respectively. This substractor 29 is typically formed by a differential amplifier. Since the phases of the output from the low-pass filters 27 and 28 are opposite to each other, the substractor 29 substantially adds the absolute values of the two input signals to form a demodulated signal by the substracting operation. The demodulated signal is extracted from the terminal O.

The phase shift circuit 22 will be described in detail in the following. FIG. 3 illustrates the phase shift characteristics of the phase shift circuit 22. The phase shift value $\phi$ on the ordinate is a shifted value of the signal at the terminal V from the signal at the terminal U of FIG. 2, whereas the frequency deviation $\Delta f$ on the abscissa is that from the intermediate frequency of the signal at the terminal U. As is understood from FIG. 3, the phase shift values $\phi$ between 0 to $-90$ degrees and between $-90$ to $-180$ degrees are substantially symmetrical, where the phase shift value $\phi$ is $-90$ degrees for a center frequency fc.

If the voltage waveforms l, m and n at the points L, M and N of FIG. 2 are assumed to be sine waves, their phase relationships can also be assumed in the manner shown in FIG. 4. Here, the amplitudes of the respective voltage waveforms l, m and n are standardized at 1 V. Moreover, if the voltages at the points M, N and L are respectively preset at $V_1$, $V_2$ and $V_3$, these values $V_1$, $V_2$ and $V_3$ are given by the following Equations (1),(2) and (3):

$$V_1 = \sin\theta \quad (1);$$

$$V_2 = -\sin\theta \quad (2);$$

and $$V_3 = \sin(\theta - \pi - \phi) \quad (3).$$

Figure 6:
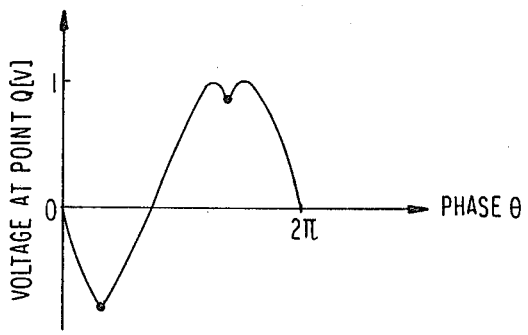

On the other hand, since the outputs (or the voltages at the points P and Q) of the OR circuits 25 and 26 have a potential value in accordance with that of the larger one of the two input signal voltages, they take such voltage waveforms as are shown in FIGS. 5 and 6, respectively. These voltage waveforms at the points P and Q are averaged through the low-pass filters 27 and 28, respectively, so that their DC voltages are attained at the points R and S. At this time, if the DC voltages at the points R and S are respectively denoted as X and Y, these voltages X and Y are expressed by the following Equations (4) and (5):

$$X = \frac{1}{2\pi}\left[\int_0^a V_1 d\theta + \int_a^b V_3 d\theta + \int_b^{c=2\pi} V_1 d\theta\right] \quad (4)$$

$$= \frac{2}{\pi}\cos\frac{\phi}{2};$$

and $$Y = \frac{1}{2}\left[\int_0^d (-V_1)d\theta + \int_d^e V_3 d\theta + \int_e^c (-V_1)d\theta\right] \quad (5)$$

$$= \frac{2}{\pi} \sin \frac{\phi}{2}.$$

The DC voltages X and Y expressed by the Equations (4) and (5) are applied to the positive input terminal (at the point R) and the negative input terminal (at the point S) of the subtractor 29, respectively, so that they are subtracted from each other and led to the FM demodulated output terminal O. The demodulated output voltage $V_O$ at the demodulated output terminal O can be deduced in the manner of Equation (6) from the Equations (4) and (5). Here, the voltage gain of the subtractor 29 is denoted by letters Av.

$$V_0 = Av \cdot (X - Y) \qquad (6)$$

$$= Av \cdot \frac{2\sqrt{2}}{\pi} \sin\left(\frac{\phi - \pi/2}{2}\right)$$

If $\Delta\phi = \phi - \pi/2$, then the Equation (6) can be changed into the following Equation (7):

$$V_0 = Av \cdot \frac{2\sqrt{2}}{\pi} \sin \frac{\Delta\phi}{2}. \qquad (7)$$

Figure 7:
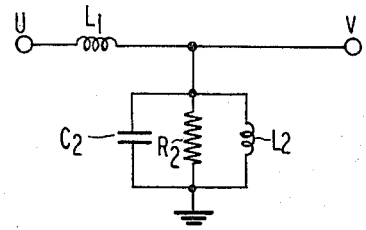

As the phase shift circuit 22 connected with the terminals U and V of FIG. 2, there is used a phase shift circuit or the like, which is composed of inductors $L_1$ and $L_2$, a capacitor $C_2$ and a resistor $R_2$, as shown in FIG. 7. The discrepancy of the terminal voltages at the terminals U and V in phase difference from $\pi/2$ becomes coincident with the aforementioned value $\Delta\phi$, whereupon this value $\Delta\phi$ can be expressed by the following Equation (8):

$$\Delta\phi = \pm\tan^{-1} \frac{2Q_L \cdot \Delta f}{fc}, \qquad (8)$$

wherein:
fc indicates the center frequency in FIG. 3;
$\Delta f$ indicates the frequency deviation from fc; and
$Q_L$ indicates the Q-value of the resonance circuit composed of the inductor $L_2$ and the condenser $C_2$ of FIG. 7.

Now, if $\Delta\phi << 1$ is assumed in the Equation (7), this Equation (7) is changed into the following Equation (9):

$$V_0 = Av \cdot \frac{2\sqrt{2}}{\pi} \cdot \frac{\Delta\phi}{2} \qquad (9)$$

$$= Av \cdot \frac{\sqrt{2}}{\pi} \cdot \Delta\phi.$$

If the Equation (8) is substituted into the above Equation (9), then the following Equation (10) is obtained:

$$V_0 \approx Av \cdot \frac{2}{\pi} \tan^{-1} \frac{2Q_L \cdot \Delta f}{fc}. \qquad (10)$$

Now, if the amplitude characteristics of the phase shift circuit (in FIG. 7) are taken into consideration, then the above Equation (10) can be approximated into the following Equation (11):

$$V_0 \approx Av \cdot \frac{2}{\pi} \tan^{-1}\left(x \cdot \frac{1}{\sqrt{1 + x^2}}\right), \qquad (11)$$

where:

$$x = \frac{2Q_L \cdot \Delta f}{fc}. \qquad (12)$$

Figure 8:
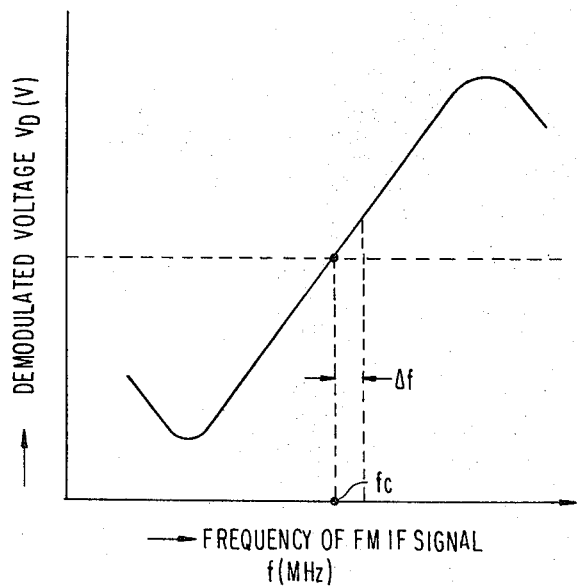

The above Equation (11) exhibits the S-letter characteristics of the FM demodulator, which are illustrated in FIG. 8. That is to say, when the frequency is deviated by $\Delta f$ from the center frequency fc, the DC level at the demodulated output terminal O draws an S-shaped curve, as shown in FIG. 8, thus making the FM demodulation possible.

Figure 9:
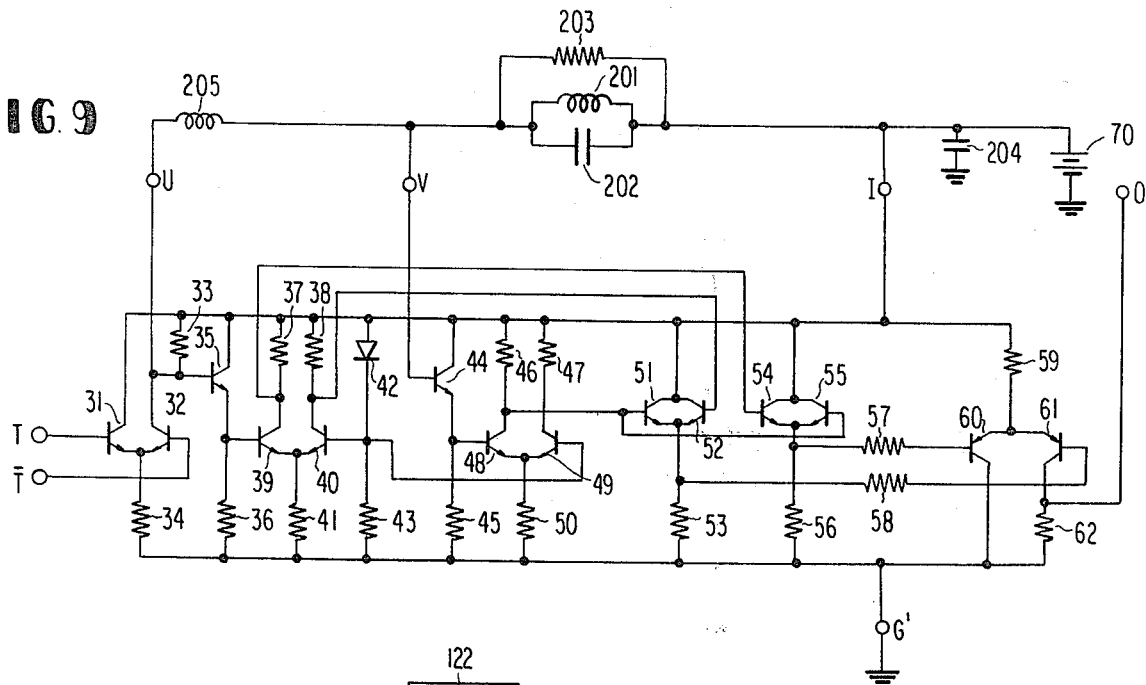
FIG. 9 is a circuit diagram showing a concrete example of the first embodiment of the present invention.

The concrete embodiment of the FM demodulator according to the first embodiment of the present invention is shown in FIG. 9. The terminals T, U, V and O correspond to the terminals T, U, V and O in FIG. 2 illustrating the principles of the present invention, respectively. On the other hand, a terminal $\overline{T}$ is the inverted input terminal of the FM intermediate frequency amplifier 21. A terminal I is a power supply terminal connected to the power voltage source 70, and a terminal G' is a grounded terminal.

A differential amplifier composed of a resistor 33, transistors 31 and 32 and a resistor 34 constitutes the last stage FM intermediate frequency amplifier 21 of FIG. 2. A differential amplifier composed of a transistor 35, resistors 36, 37, 38, 41 and 43, transistors 39 and 40 and a diode 42 constitutes the limiter amplifier 23 of FIG. 2. Inductors 201 and 205, a capacitor 202 and a resistor 203 constitute the phase shift circuit 22. Transistors 44, 48 and 49 and resistors 45, 46, 47 and 50 constitute the limiter amplifier 24. Transistors 51 and 52 and a resistor 53 constitute the OR circuit 25. Transistors 54 and 55 and a resistor 56 constitute the OR circuit 26. Resistors 57 and 58 and the parasitic capacitance of transistors 60 and 61 constitute the low-pass filters 27 and 28. The transistors 60 and 61 and resistors 59 and 62 constitute a differential amplifier and operate as the subtractor 29. In addition, a capacitor 204 is used to ground the power supply terminal I for bypassing AC component at the terminal I to the earth.

In this embodiment being described, it should be noted that all but the inductors 201 and 205, the capacitors 202 and 204, the resistor 203 and the power voltage source 70 are formed on a single semiconductor substrate into an integrated semiconductor circuit. The respective terminals T, $\overline{T}$, U, V, I, O and G' are used as lead terminals for connecting them to the external circuits and the external circuit elements.

According to this first embodiment, the low-pass filters are constituted of the capacitative impedances, as viewed from the bases of the transistors 60 and 61, and the resistors 57 and 58 so that they play the roles of the low-pass filters 27 and 28 shown in FIG. 2. It is the current practice that the low-pass filter is constructed such that the filters each composed of a resistor and a capacitor are connected in cascade in one or two steps. However, for smoothing the frequency of FM.IF frequency (10.7 MHz), it is also possible to constitute the low-pass filter using the parasitic capacitance between the base and emitter or collector of a transistor. Thus, it is possible to form the low-pass filter on a semiconductor integrated circuit.

Further, the diode 42 and the resistor 43 constitute a bias circuit for applying the base biases to the transistors 40 and 49.

As described in the above, the FM demodulator according to the present concrete embodiment employs the OR circuits whereas the conventional quadrature detection circuit resorts to the multiplier. As is apparent from FIG. 9, moreover, a voltage as high as about 1.8 V is sufficient at the power supply terminal I for applying the normal biases to the transistors 39, 40, 48, 49, 51, 52, 54 and 55 and the transistors 60 and 61, thus making it possible to provide the FM demodulator which operates normally even at a low voltage. Therefore, the FM demodulator according to the present embodiment is suitable for a portable radio which is driven by a dry cell.

Moreover, the FM intermediate frequency amplifier 21, the limiter amplifiers 23 and 24, the OR circuits 25 and 26, the low-pass filters 27 and 28 and the low-frequency amplifier 29 can all be made of simple circuit constructions, and most of them can be connected in parallel between the power supply terminal I and the ground terminal G', thus remarkably facilitating the circuit design while taking the bias or the like into consideration.

Figure 10:
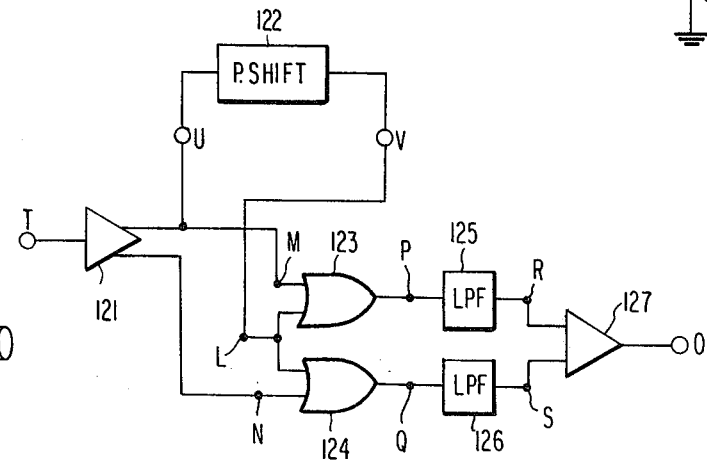
FIG. 10 is a block diagram showing a second embodiment of the present invention.

A second embodiment of the present invention will be described with reference to FIG. 10 in the following.

The terminal T is an input terminal of an FM signal converted into or an FM intermediate frequency (which will be abbreviated to "FM1F") signal from a received FM broadcasting signal. The terminals U and V are the connecting terminals of a phase shift circuit 122. The terminal O is a demodulated output terminal. An FM1F amplifier 121 generates two outputs having opposite phases to each other. One of these outputs is fed via the input terminal U to the phase shift circuit 122 and then to one input of each of the OR circuits 123 and 124 through terminal V and point L after being phase shifted by phase shift circuit 122 in accordance with the frequency deviation from the FM1F center frequency. The one output from amplifier 121 is also directly supplied to the other input of OR circuit 123 through point M. The other output is applied directly to the other input of the OR circuit 124 through point N. OR circuits 123 and 124 derive their output signals having the potential in accordance with that of the larger of their two input signals.

The outputs of OR circuits 123 and 124 are applied through the points P and Q, respectively, to low-pass filters 125 and 126 connected in the next stage and further through the points R and S, respectively, to the positive and negative input terminals of a subtractor 127. The output of the subtractor 127 is taken as the FM demodulated output at terminal O.

The second embodiment thus far described is different from the foregoing first embodiment in that the phase of one of the two outputs generated from the FM1F amplifier 121 is shifted in a quantity according to the discrepancy from the center frequency of the FM1F signal. However, since the input and output of the FM1F amplifier 121 are substantially the same signal, the second embodiment is not operationally different from the first embodiment. Therefore, the operations of the first embodiment having been described with reference to FIGS. 3 to 8 can be applied as they are to the present second embodiment.

According to the second embodiment, by merely making it possible to extract from the FM1F amplifier 121 the two outputs having their phases inverted from each other, the amplitude limiting amplifiers 23 and 24, which are connected in the next step according to the first embodiment, can be eliminated, resulting in a simplification of the circuit construction. Moreover, since the FM1F amplifier is composed of a plurality of the differential amplifiers connected in series to normally attain the amplitude limiting effect, it can be constructed easily without any design change of the FM1F amplifier for extracting from the last stage differential amplifier the two outputs having their phases inverted from each other.

Figure 11:
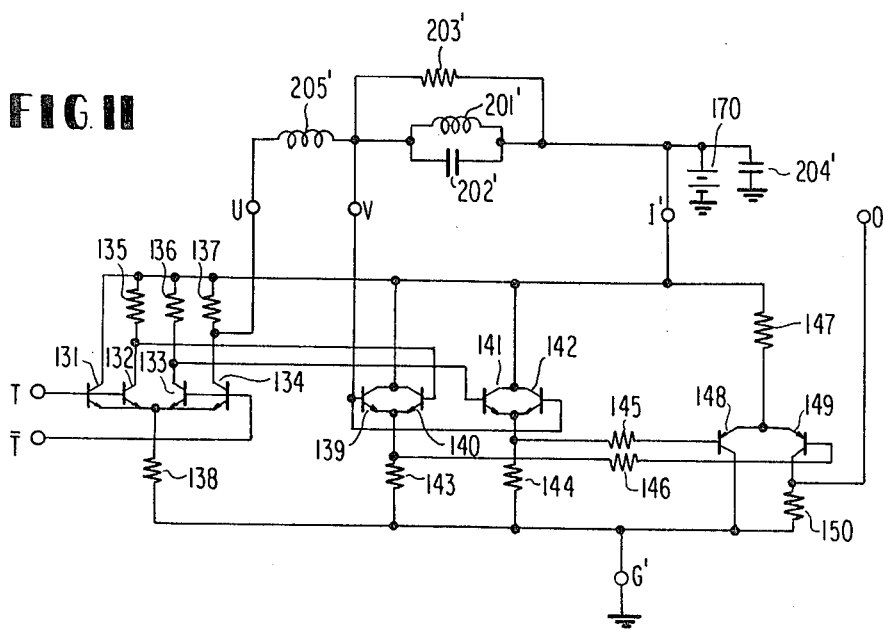
FIG. 11 is a circuit diagram showing a concrete example of the second embodiment of the present invention.

The concrete embodiment of the FM demodulator according to the second embodiment of the present invention is shown in FIG. 11. The terminals T, U, V and O correspond to the terminals T, U, V and O appearing in FIG. 10 showing the principles of this second embodiment. The terminal $\overline{T}$ is the inverted input terminal of the FM1F amplifier 121. A terminal I' is a power supply terminal to which a power voltage is fed from the power voltage source 170. The terminal G' is the grounded terminal. These terminals T, $\overline{T}$, U, V, I' and G' are formed as the lead electrodes of a semiconductor integrated circuit, and all other than the phase shift circuit composed of inductors 201' and 205', capacitors 202' and 204', a resistor 203' and a power voltage source 170 are formed into a single semiconductor chip. Transistors 131, 132, 133 and 134 and resistors 135, 136, 137 and 138 constitute the FM1F amplifier 121 or the last stage amplifier thereof. The collector output of the transistor 132 is fed to the OR circuit 123 which is composed of transistors 139 and 140 and a resistor 143. On the other hand, the collector output of the transistor 133 is fed to the OR circuit 124 which is composed of transistors 141 and 142 and a resistor 144. The transistors 139 and 142 of the respective OR circuits 123 and 124 have their bases supplied with the collector output of the transistor 134, which is shifted in phase by the phase shift circuit 122 composed of the inductors 201' and 205', the capacitor 202' and the resistor 203'. The outputs of the respective OR circuits 123 and 124 are taken out of the load resistors 143 and 144 and are fed to the subtractor 127, which is a differential amplifier composed of transistors 148 and 149 and resistors 147 and 150, through the low-pass filters 126 and 125 composed of resistors 145 and 146 and the parasitic capacitances of the transistors 148 and 149. As a result, the demodulated output is extracted through the output terminal O from the collector of the transistor 149. The capacitor 204' is used to bypass the A.C. component at the power supply terminal I' to the earth.

In order to normally bias the respective transistors 131, 132, 133, 134, 139, 140, 141, 142, 148 and 149, according to this second embodiment, it is sufficient to apply a voltage as high as about 1.8 V to the power supply terminal I'. Thus, it is possible to provide an FM demodulator which performs normal operation even in case of low power supply voltage.

The circuit also has the advantage that it can be constructed at a low cost with a reduced number of parts.

Although a limited number of embodiments of the present invention have been described hereinbefore, the demodulating operation of the angle modulated signal can be attained even if the respective circuit components such as the FM1F amplifiers 21 and 121, the amplitude limiting amplifiers 23 and 24, the OR circuits 25, 26, 123 and 124, the low-pass filters 27, 28, 125 and 126 and the subtractor 29 and 127 are replaced by others performing the same functions.

What is claimed is:

1. A demodulator comprising an input terminal for receiving an angle modulated signal, means for converting said angle modulated signal into first and second signals having their phases opposite to each other, phase shift means for shifting the phase of a signal having information of said angle modulated signal by a value in accordance with the discrepancy of the frequency thereof from the center frequency of said angle modulated signal, a first OR circuit means, connected to receive as inputs said first signal and the output of said phase shift means, for providing at its output the larger of the two inputs applied thereto, a second OR circuit means, connected to receive as inputs said second signal and the output of said phase shift means, for providing at its output the larger of the two inputs applied thereto, means for subtracting the respective outputs of said first and second OR circuit means from each other, and an output terminal for deriving a demodulated output of said angle modulated signal from said subtracting means.

2. A demodulator claimed in claim 1, further comprising a first low-pass filter inserted between said first OR circuit means and said subtracting means and a second low-pass filter inserted between said second OR circuit means and said subtracting means.

3. A demodulator claimed in claim 2, wherein said signal having information of said angle modulated signal is the angle modulated signal fed to said input terminal.

4. A demodulator claimed in claim 2, wherein said signal having information of said angle modulated signal is one of said first and second signals derived from said converting means.

5. A demodulator claimed in claim 1, 2, 3 or 4 wherein said angle modulated signal is a frequency modulated signal.

6. A demodulator comprising an input terminal for receiving a frequency modulated signal, a phase shift circuit having its input coupled to said input terminal and shifting the phase of said frequency modulated signal by a value in accordance with the discrepancy from the center frequency of said frequency modulated signal, a signal converting circuit having its input connected with said input terminal and extracting from said frequency modulated signal two signals having the information of said frequency modulated signal and being opposite in phase to each other, first means responsive to one of the outputs of said signal converting circuit and the output of said phase shift circuit for providing as its output the larger of its two inputs, second means responsive to the other of the outputs of said signal converting circuit and the output of said phase shift circuit for providing as its output the larger of its two inputs, first and second low-pass filter receiving the outputs of said first and second means, respectively, means for subtracting the outputs of said first and second low-pass filters from each other, and an output terminal, connected to said subtracting means, for deriving the output of said subtracting means.

7. A demodulator claimed in claim 6, wherein said subtracting means is a differential amplifier having two inputs receiving the outputs of said first and second low-pass filters, respectively.

8. A demodulator comprising an input terminal for receiving a frequency modulated signal, a signal converting circuit coupled to said input terminal and extracting from said frequency modulated signal two signals having the information of said frequency modulated signal and being opposite in phase to each other, phase shift means for shifting the phase of one of the outputs of said signal converting circuit by a value in accordance with the discrepancy from the center frequency of said frequency modulated signal, first means responsive to one of the outputs of said signal converting circuit and the output of said phase shift means for providing as its output the larger of its two inputs, second means responsive to the other of the outputs of said signal converting circuit and the output of said phase shift means for providing as its output the larger of its two inputs, first and second low-pass filters receiving the outputs of said first and second means, respectively, means for subtracting the outputs of said first and second low-pass filters from each other, and an output terminal, connected to said subtracting means, for deriving the output of said subtracting means.

9. A demodulator claimed in claim 8, wherein said subtracting means is a differential amplifier having two inputs receiving the outputs of said first and second low-pass filters, respectively.

10. A demodulator as claimed in claims 1,2,3,4,6,7, 8 or 9 wherein said demodulator circuitry, other than said phase shift means, is formed in an integrated circuit.

* * * * *

UNITED STATES PATENT AND TRADEMARK OFFICE
CERTIFICATE OF CORRECTION

PATENT NO. : 4,339,726
DATED : June 17, 1982
INVENTOR(S) : Masami MIURA

It is certified that error appears in the above—identified patent and that said Letters Patent is hereby corrected as shown below:

Col. 1, line 68, change "outputs means" to --output means--;

Col. 3, line 34, change "in that case" to --in the case--;

Col. 8, line 20, change "T" to --$\bar{T}$--;

Col. 10, line 9, change "filter" to --filters--.

Signed and Sealed this

Fourteenth Day of September 1982

[SEAL]

Attest:

Attesting Officer

GERALD J. MOSSINGHOFF

Commissioner of Patents and Trademarks